US005388160A

United States Patent [19]

Hashimoto et al.

[11] Patent Number: 5,388,160

[45] Date of Patent: Feb. 7, 1995

[54] NOISE SUPPRESSOR

[75] Inventors: Hiroyuki Hashimoto; Kenichi Terai, both of Osaka; Yasutoshi Nakama; Hironari Ogata, both of Nara; Chie Yano, Gifu, all of Japan

[73] Assignee: Matsushita Electric Industrial Co., Ltd., Osaka, Japan

[21] Appl. No.: 896,043

[22] Filed: Jun. 8, 1992

[30] Foreign Application Priority Data

| | | | |
|---|---|---|---|
| Jun. 6, 1991 | [JP] | Japan | 3-134828 |
| Jun. 27, 1991 | [JP] | Japan | 3-156572 |
| Feb. 6, 1992 | [JP] | Japan | 4-020951 |

[51] Int. Cl.[6] H03B 29/00

[52] U.S. Cl. 381/71; 381/94

[58] Field of Search 381/71, 94

[56] References Cited

U.S. PATENT DOCUMENTS

| | | | |
|---|---|---|---|
| 4,473,906 | 9/1984 | Warnaka et al. | 381/71 |
| 4,586,153 | 4/1986 | Hobrough . | |
| 4,677,676 | 6/1987 | Eriksson | 381/71 |
| 4,837,834 | 6/1989 | Allie | 381/71 |
| 4,914,706 | 4/1990 | Krause . | |
| 4,965,832 | 10/1990 | Edwards et al. . | |
| 5,170,433 | 12/1992 | Elliot et al. | 381/71 |

FOREIGN PATENT DOCUMENTS

| | | |
|---|---|---|
| 0103257 | 3/1984 | European Pat. Off. . |
| 0340974 | 8/1989 | European Pat. Off. . |

OTHER PUBLICATIONS

"Adaptive Digital Techniques For Audio Noise Cancellation", Paul, James E., IEEE Circuits & Systems, vol. 1, No. 4, Dec., 1979.

40th IEEE Vehicular Technology Conference, May 1990, Orlando, pp. 48–53, R. A. Goubran et al., "Acoustic Noise Suppression Using Regressive Adaptive Filtering".

*Primary Examiner*—Curtis Kuntz

*Assistant Examiner*—Mark D. Kelly

*Attorney, Agent, or Firm*—Wenderoth, Lind & Ponack

[57] ABSTRACT

In a noise suppressor, a noise signal detected by a first detector is inputted to an adaptive filter and a FIR filter. An output signal of the adaptive filter is reproduced by a speaker. The signal reproduced by the speaker and a noise signal from a noise source are detected by a second detector. The signal detected by the second detector is band-limited by a filter circuit and sent to a LMS computing circuit. The LMS computing circuit updates a coefficient of the adaptive filter so as to minimize an output signal of the filter circuit in response to an output signal of the FIR filter and an output signal of the filter circuit.

12 Claims, 14 Drawing Sheets

COHERENCE OF NOISE SIGNAL AND ERROR SIGNAL

SOUND PRESSURE AND FREQUENCY CHARACTERISTIC OF NOISE SIGNAL

SOUND PRESSURE AND FREQUENCY CHARACTERISTIC OF ERROR SIGNAL

NOISE SUPPRESSOR

BACKGROUND OF THE INVENTION

1. Field of the Invention

This invention relates to a noise suppressor which employs active noise control during noisy environmental conditions.

2. Description of the Prior Art

Recently, an active noise control method has been proposed in which environmental noise is subjected to noise suppression at a listening point thereof by outputting a control sound signal from a speaker using digital signal processing technology.

A noise suppressor according to the prior art will be described below while referring to the drawings attached.

FIG. 17 is a block diagram of a conventional noise suppressor, in which 1*a* and 1*b* are microphones, 2 is an adaptive filter, 3 a FIR (Finite Impulse Response) filter, 4 a LMS (Least Mean Square) computing circuit, and 5 a speaker.

The operation of the noise suppressor arranged as above will be explained.

A noise signal detected by the microphone 1*a* is inputted to the adaptive filter 2 and the FIR filter 3. The noise signal thus sent to the adaptive filter 2 is adaptively controlled therethrough and sent to the speaker 5 to be reproduced. The sound signal thus reproduced interferes with a noise signal from a noise source to generate an interference sound. The interference sound thus generated is detected by the microphone 1*b*. The signal thus detected is sent to the LMS computing circuit 4. Here, the FIR filter 3 has a transfer function C (=C1·C2·C3) between the speaker 5 and the microphone 1*b* set in advance, where C1 is a transfer function of the speaker 5, C2 is a spatial transfer function between the speaker 5 and the microphone 1*b* and C3 is a transfer function of the microphone 1*b*. As a result, the LMS computing circuit 4 processes an output signal of the FIR filter 3 and a signal from the microphone 1*b* to update a coefficient of the adaptive filter 2 using the following equation (1) so that the output signal of the microphone 1*b* can be minimized;

$$w(n+1)=w(n)+\alpha x'(n)c(n)e(n)=w(n)+\alpha r(n)e(n) \quad (1)$$

where

- w(n); coefficient of the adaptive filter 2, α; step parameter,
- r(n); output signal of the FIR filter 3 (filtered −x signal) $r(n)=x^T(n)c(n)$,
- e(n); output signal of the microphone 1*b*,
- x(n); output signal of the microphone 1*a*, and
- c(n); coefficient of the FIR filter 3, T; transformed matrix.

Thus, the noise signal from the microphone 1*a* is adaptively processed by the adaptive filter 2 and reproduced by the speaker 5. As a result, the reproduced sound signal by the speaker 5 is canceled with the noise signal from the noise source at the microphone 1*b*, resulting in a reduction in noise.

Such a method that the transfer function from the speaker 5 to the microphone 1*b* is identified in advance using the FIR filter 3 as explained above is called a filtered −x algorithm (see, B. Widrow and S. Stearns; "Adaptive Signal Processing", Prentice-Hall, Englewood Cliffs, N.J. 1985).

With the arrangement as shown above, however, a problem has been identified in that if the noise frequency band to be suppressed has any frequency component where the noise signal at the microphone 1*b* and the noise signal from the noise source at the microphone 1*a* are insufficiently correlated with each other, it remains uncanceled even if adaptively controlled, so that the other frequency components cannot be sufficiently canceled or may be disadvantageously diverged.

In addition, a problem has been further identified in that if the noise signal detected by the microphone 1*a* or microphone 1*b* is non-white, the noise suppression quantity is varied or the convergent time is delayed depending on the frequency.

Further in addition, a problem has been also identified in that it is impossible to cancel only the noise in a specific range of the noise band in order to cancel only such a noise that is offensive to the ear based on considerations regarding characteristics of human sensations.

SUMMARY OF THE INVENTION

This invention was made for solving the above-mentioned problems, and a first object of this invention is to provide a noise suppressor in which even if a noise frequency band to be suppressed has any range that is insufficient in correlation, it can be removed therefrom and the other part can be subjected to noise suppression stably, efficiently and sufficiently.

In addition, the invention provides a noise suppressor in which even if there exists a peak point in sound pressure of a noise frequency band to be suppressed, only such a range that the peak point exists can be suppressed efficiently.

Further the invention provides a noise suppressor in which even if each detected signal is non-white, a noise suppression quantity at each frequency can be controlled, and an auditory sensation characteristic can be corrected to be suppressed.

A second object of this invention is to provide a noise suppressor capable of eliminating such a problem that arises in attaining the first object of this invention in which if there exists any signal that is not a target to be suppressed as a noise signal, such signal may remain to increase the noise additionally despite the fact that noise suppression can be sufficiently performed for those other than such signal.

A third object of this invention is to provide a noise suppressor capable of making an adaptive filter converge quickly, thereby performing noise suppression more efficiently.

A fourth object of this invention is to provide a noise suppressor capable of attaining the first and second objects of this invention simultaneously as well as more reliably.

A fifth object of this invention is to provide a noise suppressor capable of attaining the first and third objects of this invention simultaneously as well as more reliably.

In order to attain the first object of this invention, a noise suppressor comprises a first detector for detecting a noise or a vibration from a noise source, an adaptive filter for processing a noise signal detected by the first detector, a speaker for reproducing an output signal of the adaptive filter, a second detector for detecting a noise signal at a predetermined evaluating point, a filter circuit for processing an output signal of the second detector, a digital filter for processing the noise signal from the first detector using a coefficient substantially equivalent to a transfer function from the speaker to the filter circuit including the second detector, and a coefficient updating circuit for controlling a coefficient of the adaptive filter by an output signal from the filter circuit and an output signal from the digital filter.

In order to attain the second object of this invention, a noise suppressor comprises a first detector for detecting a noise or a vibration from a noise source, an adaptive filter for processing a noise signal detected by the first detector, a filter circuit for processing an output signal of the adaptive filter, a speaker for reproducing an output signal of the filter circuit, a second detector for detecting a noise signal at a predetermined evaluating point, a digital filter for processing the noise signal from the first detector using a coefficient substantially equivalent to a transfer function from the filter circuit through the speaker to the second detector, and a coefficient updating circuit for controlling a coefficient of the adaptive filter by the noise signal from the second detector and an output signal from the digital filter.

In order to attain the third object of this invention, a noise suppressor comprises a first detector for detecting a noise or a vibration from a noise source, a filter circuit for processing a noise signal detected by the first detector, an adaptive filter for processing an output signal of the filter circuit, a speaker for reproducing an output signal of the adaptive filter, a second detector for detecting a noise signal at a predetermined evaluating point, a digital filter for processing an output signal of the filter circuit using a coefficient substantially identical to a transfer function from the speaker to the filter circuit, and a coefficient updating circuit for controlling a coefficient of the adaptive filter by the noise signal from the second detector and an output signal from the digital filter.

In order to attain the fourth object of this invention, a noise suppressor comprises a first detector for detecting a noise or a vibration from a noise source, an adaptive filter for processing a noise signal detected by the first detector, a first filter circuit for processing an output signal of the adaptive filter, a speaker for reproducing an output signal of the first filter, a second detector for detecting a noise signal at a predetermined evaluating point, a second filter circuit for processing the noise signal from the second detector, a digital circuit for processing the noise signal from the first detector using a coefficient substantially equivalent to a transfer function from the first filter circuit through the speaker and second detector to the second filter circuit, and a coefficient updating circuit for controlling a coefficient of the adaptive filter by an output signal from the digital filter and an output signal from the second filter circuit.

And, in order to attain the fifth object of this invention, a noise suppressor comprises a first detector for detecting a noise or a vibration from a noise source, a first filter circuit for processing a noise signal detected by the first detector, an adaptive filter for processing an output signal of the first filter circuit, a speaker for reproducing an output signal of the adaptive filter, a second detector for detecting a noise signal at a predetermined evaluating point, a second filter circuit for processing the noise signal from the second detector, a digital filter for processing an output signal of the first filter circuit using a coefficient substantially equivalent to a transfer function from the speaker through the second detector to the second filter circuit, and a coefficient updating circuit for controlling a coefficient of the adaptive filter by an output signal from the digital filter and an output signal from the second filter circuit.

In a first aspect of this invention, an error signal is subjected to band limitation by the filter circuit, thereby controlling the adaptive filter by the signal thus obtained. As a result, an advantageous noise suppressor can be realized in which even if the noise frequency band to be suppressed thereof has any range that is insufficient in correlation, it can be removed therefrom to be subjected to noise suppression effectively, in which even if there exists a peak point in sound pressure of the noise frequency band to be suppressed, only such range can be efficiently canceled, and in when even if each detected signal is non-white, a noise suppression quantity at each frequency can be controlled and an auditory sensation characteristic can be corrected, thus making possible for the frequency band that is desired to be effectively noise-suppressed.

In a second aspect of this invention, an advantageous noise-suppressor can be realized that is arranged such that the filter circuit is provided next to the adaptive filter to band-limit a signal to be reproduced by the speaker. As a result, additionally to the effects obtained by the first aspect of this invention, such an effect can be obtained that any noise signal that is not a target to be suppressed can be prevented from becoming a noise additive.

In a third aspect of this invention, an advantageous noise suppressor can be realized in which the filter circuit is provided precedently to the adaptive filter to band-limit an input signal to the adaptive filter. As a result, additionally to the effect obtained by the second aspect of this invention, such an effect can be obtained that the adaptive filter can be efficiently converged.

In a fourth aspect of this invention, an advantageous noise suppressor can be realized in which the first filter circuit is provided next to the adaptive filter to band-limit a signal to be reproduced by the speaker, and an error signal is band-limited by the second filter circuit. As a result, the effects obtained by the first and second aspects of this invention can be realized simultaneously as well as more reliably, thus being capable of effectively performing noise suppression.

In a fifth aspect of this invention, an advantageous noise suppressor can be realized in which the first filter is provided precedently to the adaptive filter to band-limit an input signal to the adaptive filter, and an error signal is band-limited by the second filter circuit. As a result, the effects obtained by the first and third aspects of this invention can be realized simultaneously as well as more reliably, thus being capable of effectively performing noise suppression.

BRIEF DESCRIPTION OF THE DRAWINGS

FIG. 2(*b*) is a diagram showing a sound pressure and frequency characteristic of a noise signal.

FIG. 2(*c*) is a diagram showing a sound pressure and frequency characteristic of an error signal.

FIG. 4(*b*) is a diagram showing a change of an error signal when a filter circuit is provided.

FIG. 5(*b*) is a diagram showing a sound pressure and frequency characteristic of an error signal.

FIG. 6(*b*) is a diagram showing a change of an error signal when a filter circuit is not provided.

FIG. 6(*c*) is a diagram showing a change of an error signal when a filter circuit is provided.

FIG. 7(*b*) is a diagram showing a change of an error signal when a filter circuit is not provided.

FIG. 7(*c*) is a diagram showing an amplitude and frequency characteristic of a filter circuit.

FIG. 7(*d*) is a diagram showing a change of an error signal when a filter circuit is provided.

FIG. 8(*b*) is a diagram showing a change of an error signal when a filter circuit is not provided.

FIG. 8(*c*) is a diagram showing an amplitude and frequency characteristic of a filter circuit.

FIG. 8(*d*) is a diagram showing a change of an error signal when a filter circuit is provided.

DESCRIPTION OF THE PREFERRED EMBODIMENTS

Figure 1:
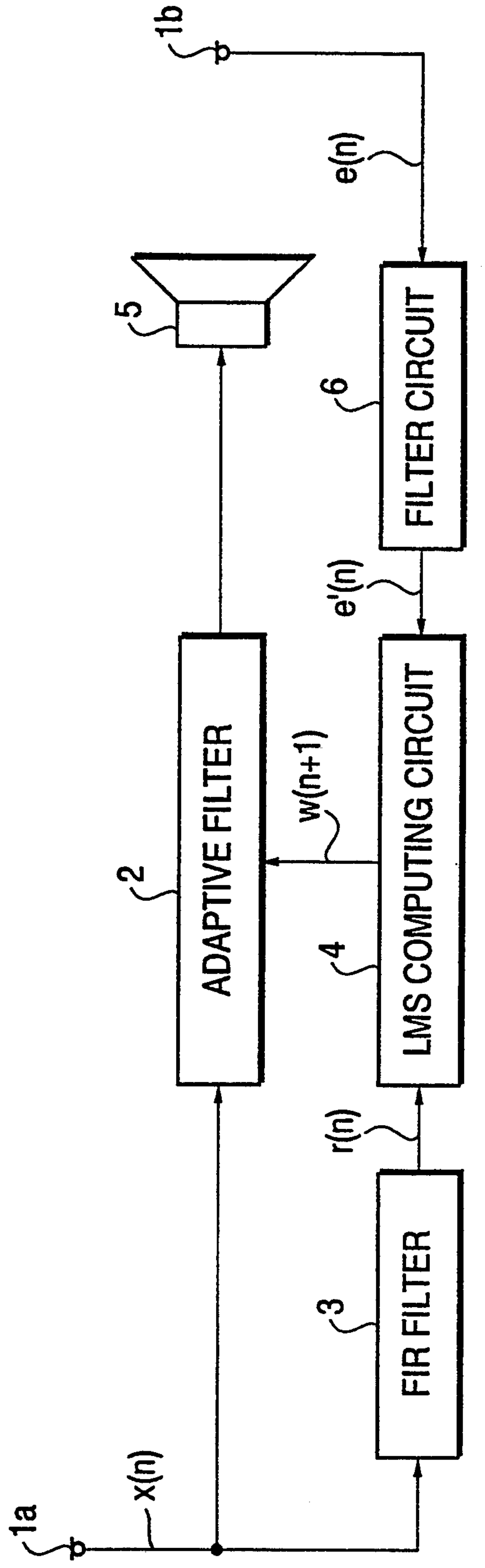
FIG. 1 is a block diagram of a noise suppressor according to a first embodiment of a first aspect of this invention.

A noise suppressor according to a first embodiment of a first aspect of this invention will be described below while referring to the drawings attached.

FIG. 1 is a block diagram of a noise suppressor of a first embodiment of the first aspect of this invention. In which, **1*a* and 1*b* are microphones which are a first detector and a second detector, respectively, 2 is an adaptive filter, 3 a FIR filter, 4 a LMS computing circuit, 5 a speaker and 6** a filter circuit.

Figure 2A:
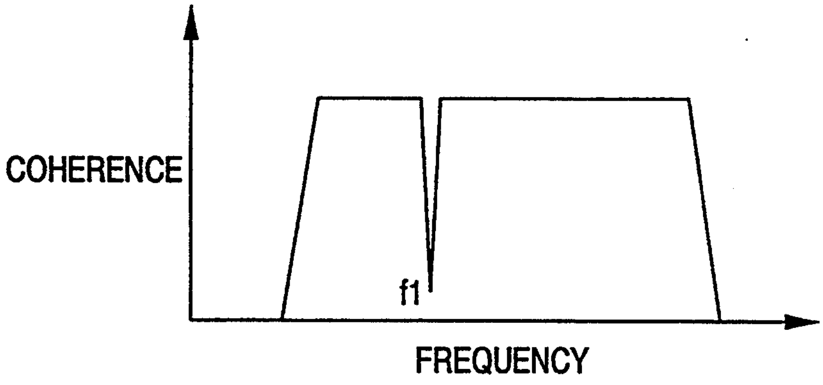
FIG. 2(*a*) is a diagram showing a coherence of a noise signal and an error signal.
Figure 2B:
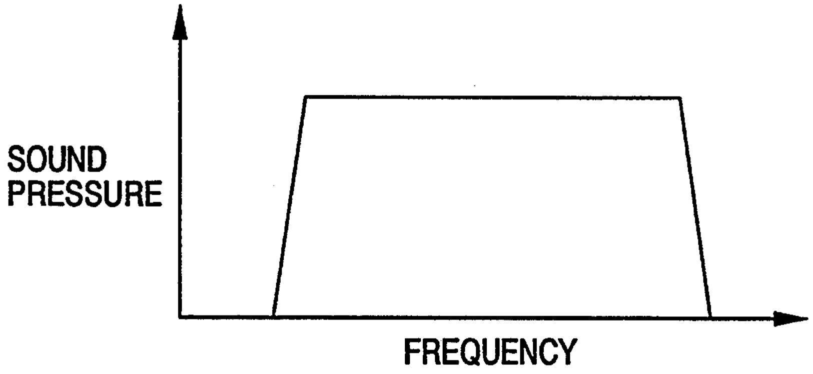
Figure 2C:
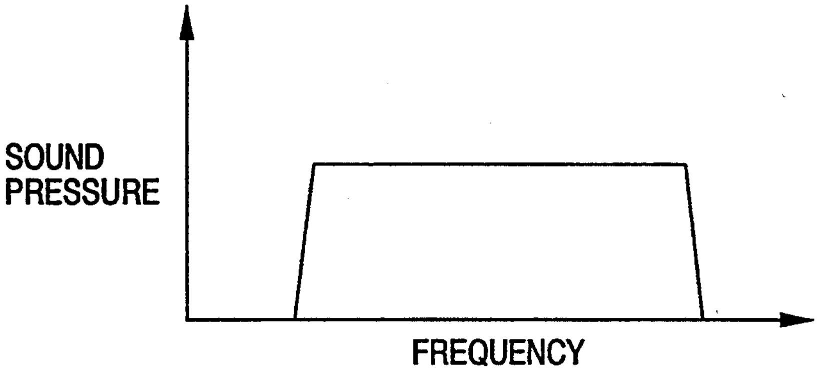
Figure 3:
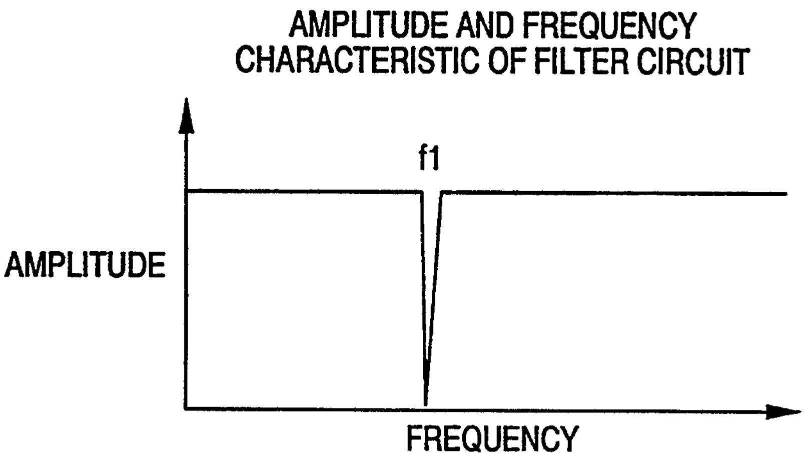
FIG. 3 is a diagram showing an amplitude and frequency characteristic of a filter circuit.

The operation of the noise suppressor arranged as above will be explained below. Suppose that if a noise signal detected by the microphone **1*a* and an error signal detected by the microphone 1*b* are shown respectively as in FIG. 2, the filter circuit 6 can be characterized as shown in FIG. 3. The noise signal thus detected by the microphone 1*a* is adaptively controlled by the adaptive filter 2 and reproduced by the speaker 5. Then, the reproduced signal by the speaker 5 interferes with a noise signal from a noise source, and an interference sound signal thus generated is detected by the microphone 1*b* as an error signal. Next, the error signal thus obtained is sent to the filter circuit 6 in which a frequency f1 having small correlativity is removed because the filter circuit 6 is characterized as shown in FIG. 3. The error signal thus band-limited is sent to the LMS computing circuit 4. On the other hand, the noise signal detected by the microphone 1*a* is processed by the FIR filter 3 and sent to the LMS computing circuit 4. The LMS computing circuit 4 processes these two signals to update a coefficient of the adaptive filter 2. The FIR filter 3 has been set to have a transfer function from the speaker 5 to the filter circuit 6 (C=C1·C2·C3·F·C3·F) from the speaker 5 to the filter circuit 6 in where C1 is a transfer function of the speaker 5, C2 is a transfer function between the speaker 5 and the microphone 1*b*, C3 is a transfer function of the microphone 1*b* and F is a transfer function of the filter circuit 6). The transfer function C is set in the FIR filter 3 as filter coefficients c(n). Accordingly, the LMS computing circuit 4 receives the outputs of the FIR filter 3 and the filter circuit 6 and updates the coefficient of the adaptive filter 2 so as to minimize the output signal of the filter circuit 6** by using the following equation (2):

$$w(n+1)=w(n)+\alpha x^T(n)c(n)e^T(n)f(n)=w(n)+\alpha r(n)e'(n) \quad (2)$$

where

W(n); coefficient of the adaptive filter 2, α; step parameter, r(n); output signal of the FIR filter 3 (filtered −x signal), $r(n)=x^T(n)c(n)$, e(n); output signal of the microphone **1*b*, x(n); output signal of the microphone 1*a*, c(n); coefficient of the FIR filter 3** f(n); coefficient of the filter circuit 6, and e'(n); output signal of the filter circuit 6 $e'(n)=e^T(n)f(n)$ T; transformed matrix.

Figure 4A:
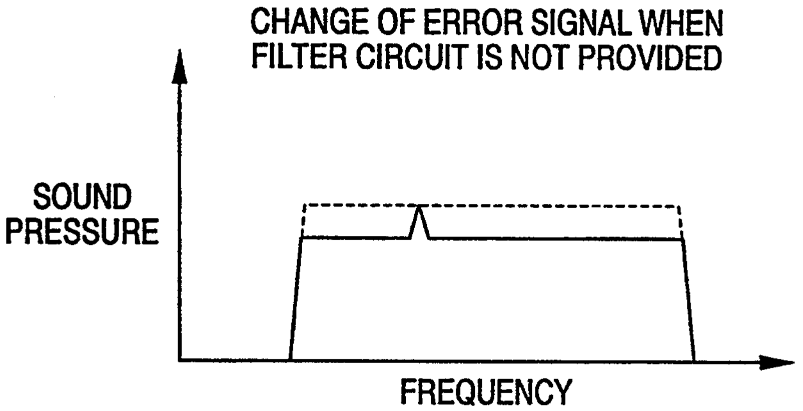
FIG. 4(*a*) is a diagram showing a change of an error signal when a filter circuit is not provided.
Figure 4B:
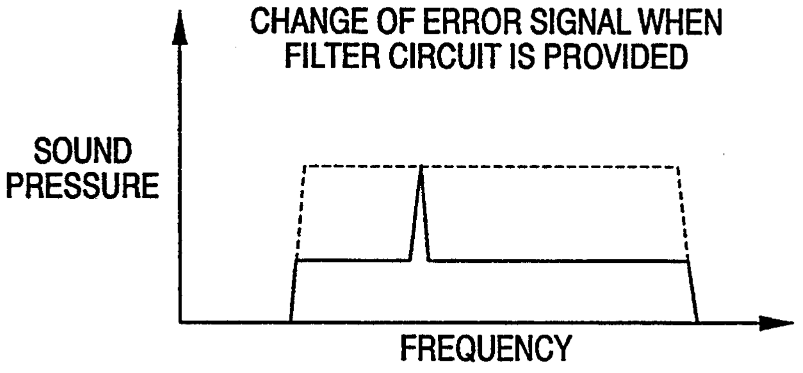

From Eq.(2), the coefficient of the adaptive filter 2 is updated so that the output signal of the filter circuit 6 can be minimized. That is, because the signal detected by the microphone **1*b* has the frequency component f1 removed therefrom by passing through the filter circuit 6 characterized as shown in FIG. 3, the frequency band thereof is not subjected to coefficient updating, but the frequency band other than this is subject to coefficient updating. This means that the reproduced sound signal from the speaker 5** and a noise signal from a noise source are canceled with each other. As a result, as shown in FIG. 4(*b*), the noise signal with the frequency component f1 is not attenuated, but those with the other frequency components are sufficiently attenuated due to no effect by the frequency component f1. When the filter circuit 6 is not provided, the result is shown in FIG. 4(*a*), which indicates that the noise signal with the frequency component f1, which is small in correlativity, is not attenuated, and those with the other frequency components become small in attenuation. In addition, it may be dispersed in some cases caused by the effect of the frequency f1.

In addition, in a case where only the frequency band exceeding or not exceeding the frequency component f1 is to be attenuated, the filter circuit 6 may be made of a high-pass filter (HPF) or low-pass filter (LPF) whose pass band does not contain the frequency f1.

Figure 5A:
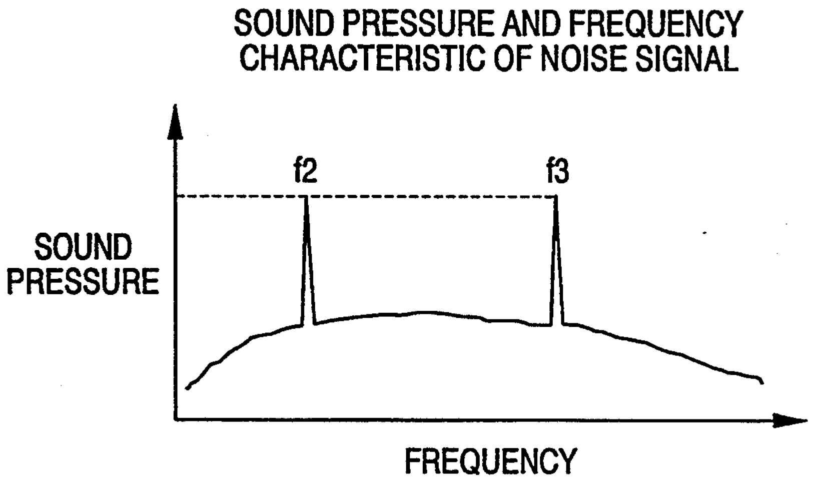
FIG. 5(*a*) is a diagram showing a sound pressure and frequency characteristic of a noise signal.
Figure 5B:
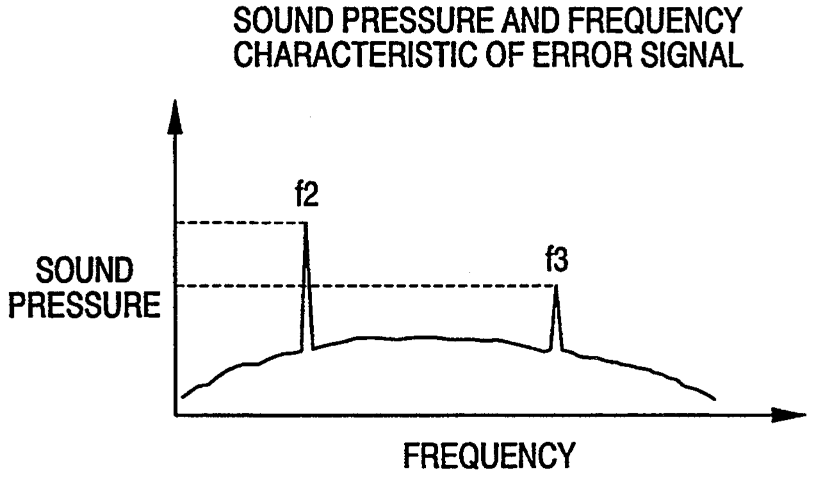
Figure 6A:
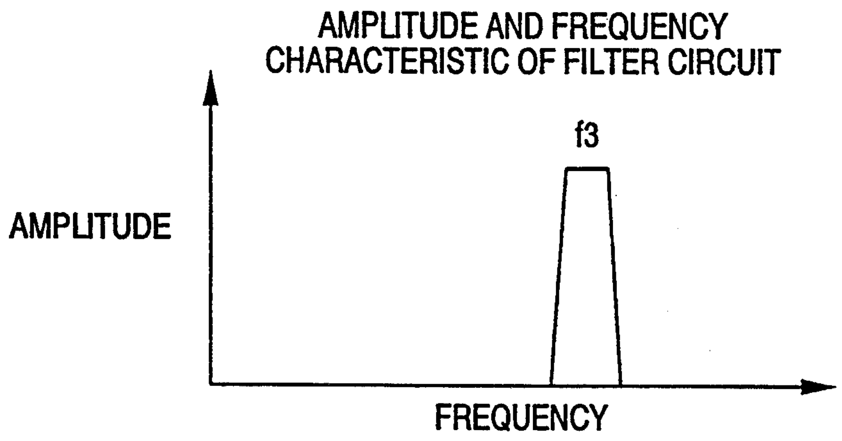
FIG. 6(*a*) is an amplitude and frequency characteristic of a filter circuit.
Figure 6B:
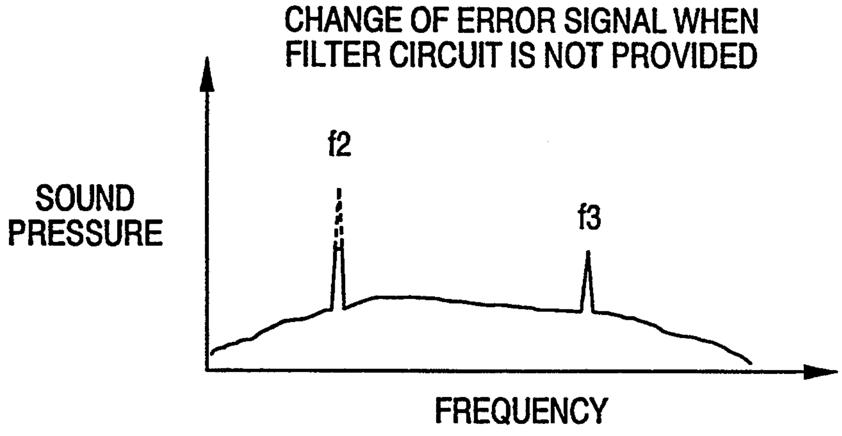
Figure 6C:
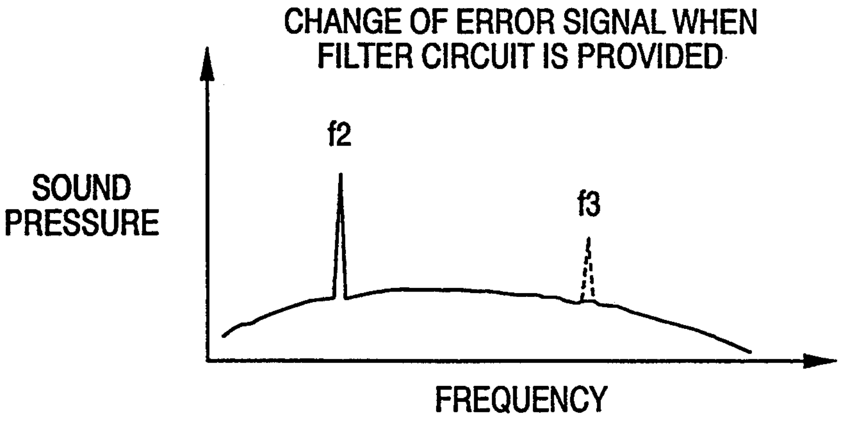
Figure 7A:
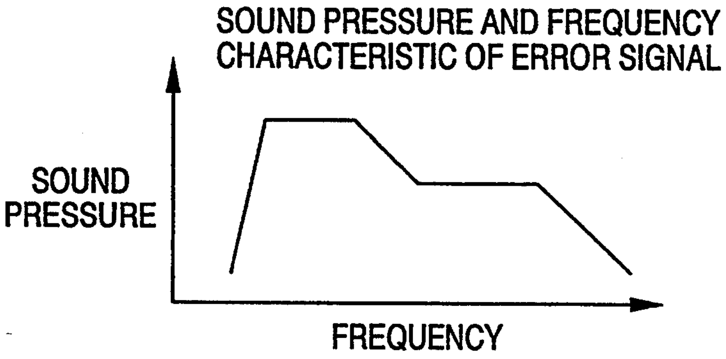
FIG. 7(*a*) is a diagram showing a sound pressure and frequency characteristic of an error signal.
Figure 7B:
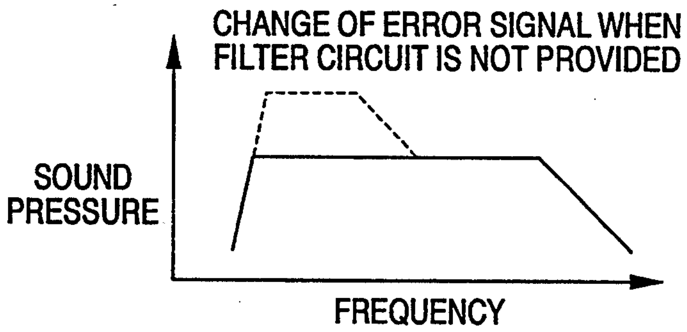
Figure 7C:
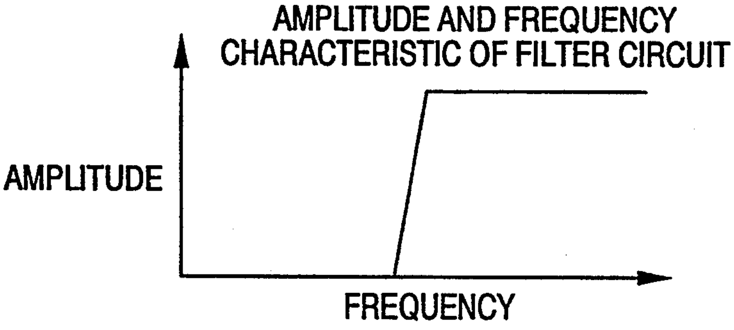
Figure 7D:
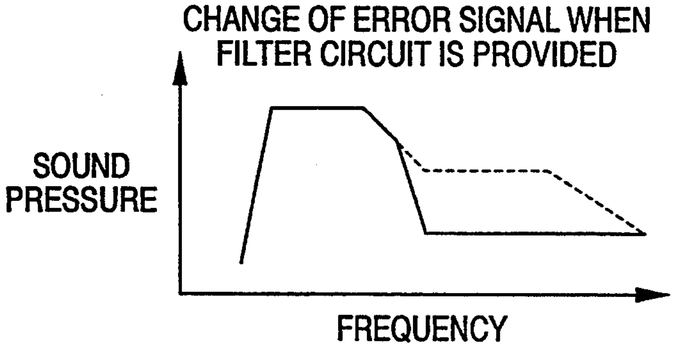
Figure 8A:
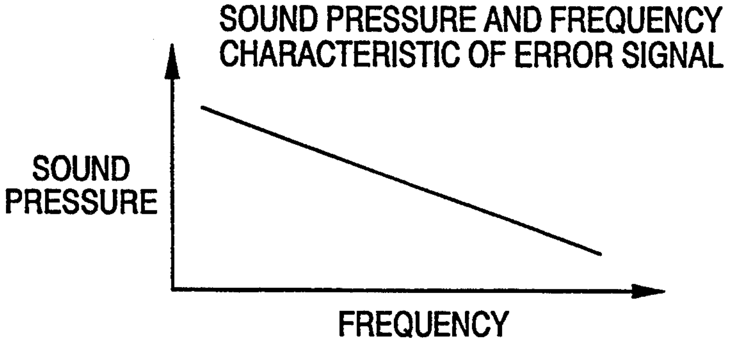
FIG. 8(*a*) is a diagram showing a sound pressure and frequency characteristic of an error signal.
Figure 8B:
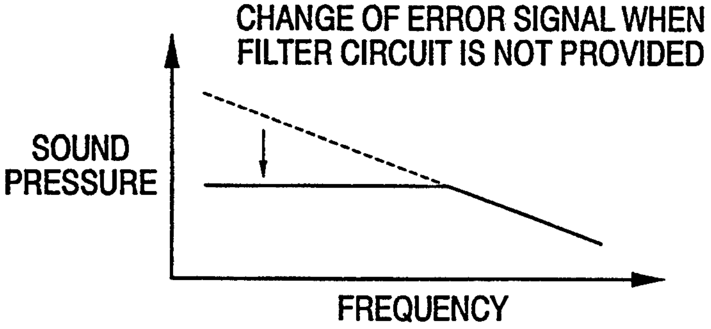
Figure 8C:
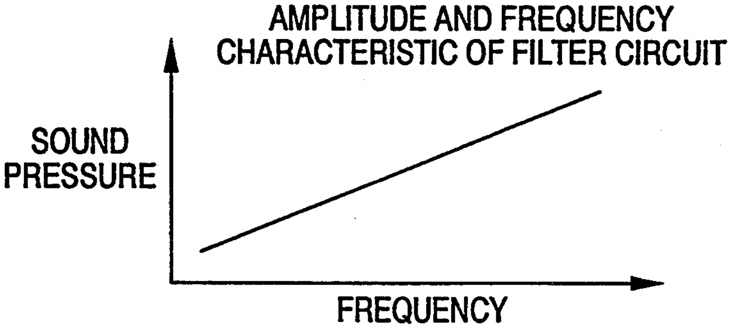
Figure 8D:
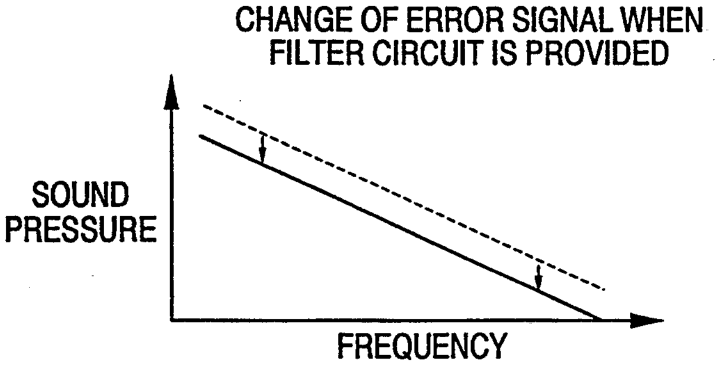

Next, in a case where the noise signal and error signal are shown respectively by FIG. 5(*a*) and (*b*), when the filter circuit 6 is not provided, a noise signal with a frequency f3 is not sufficiently attenuated as shown in FIG. 6(*b*), and as a result, such a sound that is acoustically offensive to ear may remain. In such a case, by providing the filter circuit 6 characterized as shown in FIG. 6(*a*), the noise signal with the frequency f3 can be sufficiently attenuated, and as a result, the offensive noise to the ear is canceled, clearly indicating that the sound suppression can be effected on an acoustic basis.

In addition, in a case when the error signal is as shown in FIG. 7(*a*), if the filter circuit 6 is not provided, a noise signal with a low frequency band is attenuated as shown in FIG. 7(*b*). In this case, however, a noise signal with a high frequency band is more acoustically offensive to the human ear than that with a low frequency band characteristically. This means that the noise suppression as shown in FIG. 7(*b*) may not be acoustically sufficiently. In such a case, by providing the filter circuit 6 characterized as shown in FIG. 7(*c*), only the noise signal with the high frequency band can be sufficiently attenuated as shown in FIG. 7(*d*), resulting in a sufficiently noise-suppressed sound which is acoustically pleasing.

These two examples are explained based on the assumption that a frequency component f2 and a low frequency component are controllable. However, in such a case that they are difficult to be controlled due to the characteristic of the speaker 5 and/or the acoustic characteristic resulting from the arrangement of the speaker 5 and the microphone 1*b*, the attenuation will become almost impossible over all the frequency bands. However, by cutting-off such frequency bands which are difficult to control with the filter circuit 6, the other frequency bands that are possible to control, can be sufficiently attenuated.

In a case where a signal from a noise source detected by the microphone 1*b* is characterized as shown in FIG. 8(*a*), when the filter circuit is not provided, as shown in FIG. 8(*b*), the noise suppression quantity may be varied or the converging time may be delayed depending on the frequency band. In such a case, by providing the filter circuit 6 capable of controlling the frequency characteristic as an equalizer does as shown in FIG. 8(*c*), the noise suppression can be made as characterized in FIG. 8(*d*), resulting in obtaining the noise suppression quantity at the same level over all the frequency bands. Also, this can even be responsive to the case where the frequency characteristic of the error signal is complex, so that the noise suppression can be quickly responsive to any frequency band that is desired.

As explained above, according to this embodiment, by providing the filter circuit 6, the error signal can be band-limited, so that only the desired frequency band can be noise-suppressed stably and yet sufficiently.

Next, a noise suppressor according to a second embodiment of the first aspect of this invention will be described below while referring to the drawings attached.

An object of this embodiment is to obtain a characteristic of the filter circuit 6 shown in the first embodiment using a correlation computing circuit to thereby to perform an adaptive operation using signals which are highly correlative with each other.

Figure 9:
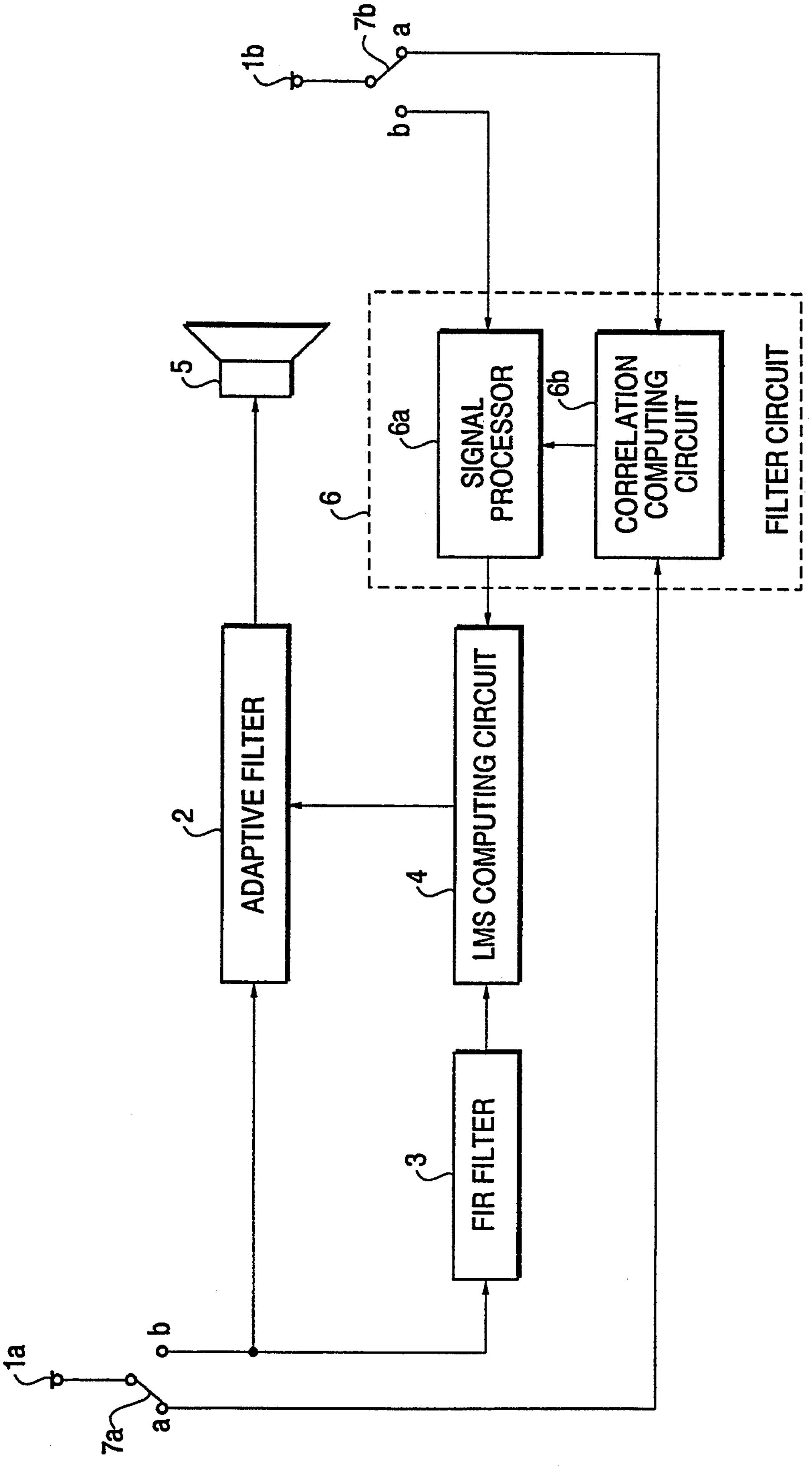
FIG. 9 is a block diagram of a noise suppressor according to a second embodiment of the first aspect of this invention.

FIG. 9 is a block diagram of a noise suppressor of the second embodiment of the first aspect of this invention. In FIG. 9, 1*a* and 1*b* are microphones which are a first detector and a second detector, respectively, 2 is an adaptive filter, 3 a FIR filter, 4 a LMS computing circuit, 5 a speaker, 6*a* a signal processor, 6*b* a correlation computing circuit, and 7*a* and 7*b* are switches, in which the signal processor 6*a* and correlation computing circuit 6*b* constitute a filter circuit 6.

The operation of the noise suppressor arranged as shown above will be explained below. In FIG. 9, first, the switches 7*a* and 7*b* respectively select the a-sides to send a noise signal from the microphone 1*a* and a signal detected by the microphone 1*b* to the correlation computing circuit 6*b*. The correlation computing circuit 6*b* computes a correlation coefficient of the two signals thus sent to thereby set it as the filter coefficient into the signal processor 6*a*. Next, the switches 7*a* and 7*b* respectively selected the b-sides to send the noise signal from the microphone 1*a* to the adaptive filter 2 and the FIR filter 3, and the error signal detected by the microphone 1*b* is sent to the signal processor 6*a*. An output signal of the signal processor 6*a* is sent to the LMS computing circuit 4. On the other hand, the noise signal from the microphone 1*a* is processed by the FIR filter 3 and sent to the LMS computing circuit 4. Thus, the LMS computing circuit 4 updates a coefficient of the adaptive filter 2 in response to these two signals thus inputted. Here, the FIR filter 3 has been identified with a transfer function from the speaker 5 to the signal processor 6 in advance. As a result, the coefficient of the adaptive filter 2 is updated so as to minimize the output signal of the signal processor 6*a*. As a result, a noise signal from a noise source can be acoustically suppressed by a control sound signal from the speaker 5. As shown above, the adaptive operation can be carried out by the correlation computing circuit 6*b* using only such a signal that is highly correlated with the noise signal from the noise source effecting on the microphone 1*b*, so that the coefficient updating can be achieved with no malfunction, resulting in an advantageous noise suppression effect.

Next, a third embodiment of the first aspect of this invention will be described below while referring to the drawings attached. An object of this embodiment is to obtain a characteristic of the filter circuit 6 shown in the first embodiment with a coherence computing circuit and a Hilbert computing circuit to perform the adaptive operation using signals which are highly correlative with each other.

Figure 10:
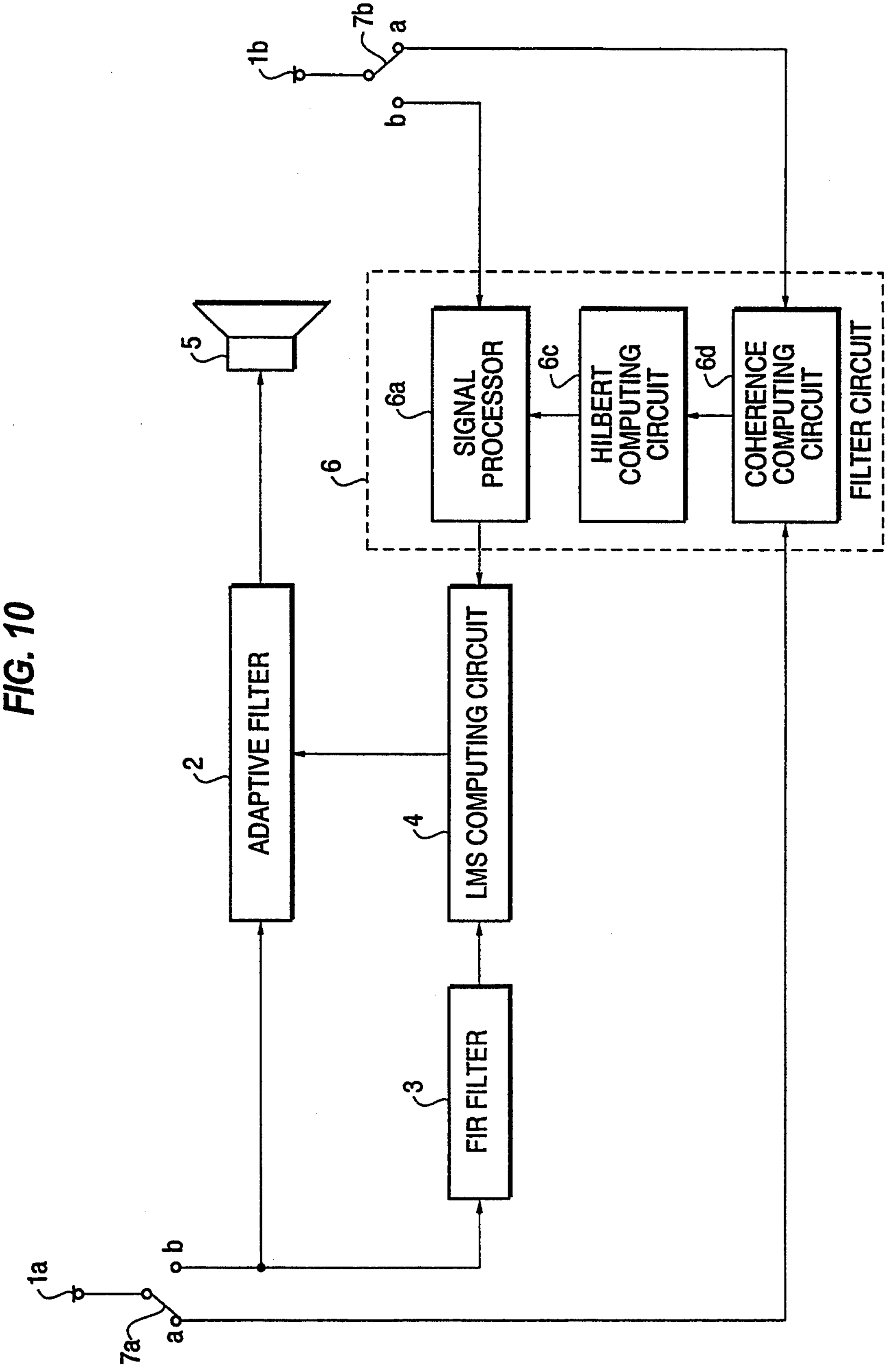
FIG. 10 is a block diagram of a noise suppressor according to a third embodiment of the first aspect of this invention.

FIG. 10 is a block diagram of a noise suppressor according to the third embodiment of the first aspect of this invention. In FIG. 10, 1*a* and 1*b* are microphones which are a first detector and a second detector, respectively, 2 is an adaptive filter, 3 a FIR filter, 4 a LMS filter, 5 a speaker, 6*a* a signal processor, 6*c* a Hilbert computing circuit, 6*a* a coherence computing circuit, and 7*a* and 7*b* are switches, in which the signal processor 6*a*, Hilbert computing circuit 6*c* and coherence computing circuit 6*d* constitute a filter circuit 6.

The operation of the noise suppressor arranged as above will be explained below. In FIG. 10, first, the switches 7*a* and 7*b* respectively select the a-sides to send a noise signal from the microphone 1*a* and a signal detected by the microphone 1*b* to the coherence computing circuit 6*d*, thereby computing a coherence function of both signals. The coherence function thus obtained is sent to the Hilbert computing circuit 6*c* to compute its minimum phase characteristic and convert it into a time domain, and sent to the signal processor 6*a* as the filter coefficient. Next, the switches 7*a* and 7*b* select the b-sides to send the noise signal from the microphone 1*a* to the adaptive filter 2 and FIR filter 3, and to send the error signal from the microphone 1*b* to the signal processor 6*a*, respectively. An output of the signal processor 6*a* is sent to the LMS computing circuit 4. On the other hand, the noise signal from the microphone 1*a* is processed by the FIR filter 3 and sent to the LMS computing circuit 4. Thus, the LMS computing circuit 4 processes these two signals to update a coefficient of the adaptive filter 2. Here, the FIR filter 3 has been identified to have a coefficient substantially equivalent to a transfer function from the speaker 5 to the signal processor 6 in advance. As a result, the coefficient of the adaptive filter 2 is updated so as to minimize the output of the signal processor 6*a* so that a noise signal from a noise source is suppressed by a control sound signal from the speaker 5. As shown above, the adaptive operation can be carried out by the coherence computing circuit 6*d* using only such a signal that is highly correlated with the noise signal from the noise source effecting on the microphone 1*b*, so that the coefficient updating can be achieved with no malfunction, resulting in an advantageous noise suppression effect.

Next, a noise suppressor according to a fourth embodiment of the first aspect of this invention will be described below while referring to the drawings attached. An object of this embodiment is to obtain a characteristic of the filter circuit 6 shown in the first embodiment using a whitening circuit to flatten an error signal, thereby performing an adaptive operation.

Figure 11:
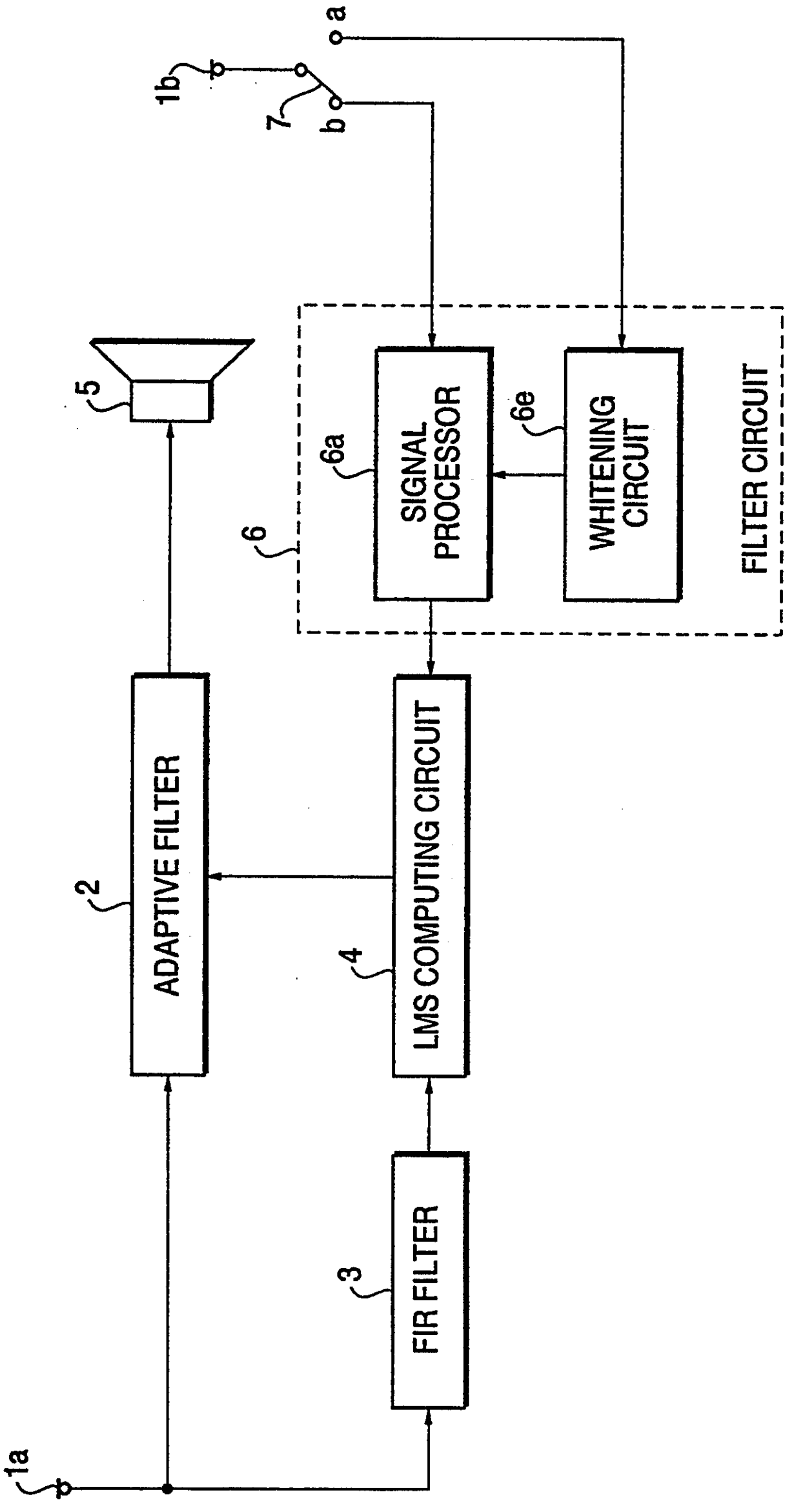
FIG. 11 is a block diagram of a noise suppressor according to a fourth embodiment of the first aspect of this invention.

FIG. 11 is a block diagram of a noise suppressor according to a fourth embodiment of the first aspect of this invention. In FIG. 11, 1*a* and 1*b* are microphone which are a first detector and a second detector, respectively, 2 is an adaptive filter, 3 a FIR filter, 4 a LMS computing circuit, 5 a speaker, 6*a* a signal processor, 6*e* a whitening circuit, and 7 a switch, in which the signal processor 6*a* and the whitening circuit 6*e* constitute a filter circuit 6.

The operation of the noise suppressor arranged as above will be explained below. In FIG. 11, first, the switch 7 selects the a-side to send a signal detected by the microphone 1*b* to the whitening circuit 6*e* to control the frequency characteristic thereof so as to make it flat. The frequency characteristic thus controlled to be flat is set into the signal processor 6*a* as the filter coefficient. Next, the switch 7 selects the b-side to send a noise signal from the microphone 1*a* to the adaptive filter 2 and the FIR filter 3 as well as to send an error signal from the microphone 1*b* to the signal processor 6*a*. An output signal of the signal processor 6*a* is sent to the LMS computing circuit 4. On the other hand, the noise signal from the microphone 1*a* is processed by the FIR filter 3 and sent to the LMS computing circuit 4. Thus, the LMS computing circuit 4 processes these two signals to update a coefficient of the adaptive filter 2. Here, the FIR filter 3 has been set to have a coefficient substantially equivalent to a transfer function from the speaker 5 to the signal processor 6*a* in advance. As a result, the coefficient of the adaptive filter 2 is updated so as to minimize the output of the signal processor 6*a* so that a noise signal from a noise source is suppressed by a control sound signal from the speaker 5. As shown above, the error signal detected by the microphone 1*b* is flattened by the whitening circuit 6*e*, and the adaptive operation is carried out using the signal thus flattened, so that the noise suppression quantity can be attained at the same level in respective frequency bands, and the converging rate in low frequency bands where the noise level is low can be improved.

Next, a noise suppressor according to a fifth embodiment of the first aspect of this invention will be described below while referring to the drawings attached. An object of this embodiment is to obtain a characteristic of the filter circuit 6 shown in the first embodiment using a whitening circuit to flatten an error signal, thereby performing an adaptive operation.

Figure 12:
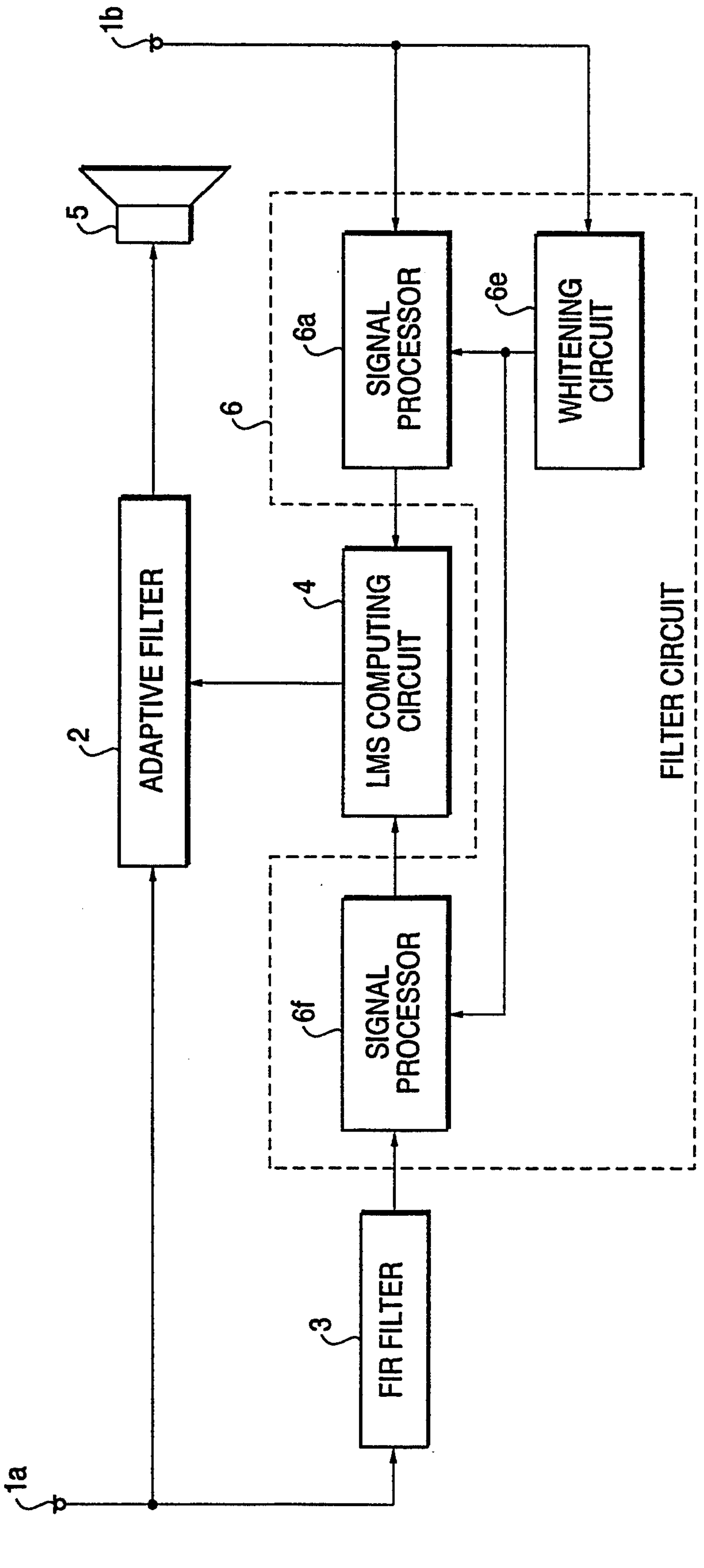
FIG. 12 is a block diagram of a noise suppressor according to a fifth embodiment of the first aspect of this invention.

FIG. 12 is a block diagram of a noise suppressor according to a fifth embodiment of the first aspect of this invention. In FIG. 12, 1*a* and 1*b* are microphones which are a first detector and a second detector, respectively, 2 is an adaptive filter, 3 a FIR filter, 4 a LMS computing circuit, 5 a speaker, 6*a* and 6*f* are signal processors, 6*e* a whitening circuit and 7 a switch, in which the signal processors 6*a* and 6*f* and the whitening circuit 6*e* constitute a filter circuit 6.

The operation of the noise suppressor arranged as above will be explained below. In FIG. 12, first, a signal detected by the microphone 1*b* is sent to the whitening circuit 6*e* to control a frequency characteristic of the detected signal to be made flat, and the frequency characteristic thus controlled to be flat is set into the signal processors 6*a* and 6*f* as their filter coefficients. On the other hand, the FIR filter 3 has been identified with a transfer function from the speaker 5 to the microphone 1*b* in advance. A noise signal from the microphone 1*a* is sent to the adaptive filter 2 and the FIR filter 3, and an error signal from the microphone 1*b* is sent to the signal processor 6*a* and the whitening circuit 6*e*. An output signal of the signal processor 6*a* is sent to the LMS computing circuit 4. On the other hand, the noise signal from the microphone 1*a* is processed by the FIR filter 3, then by the signal processor 6*f* and sent to the LMS computing circuit 4. Thus, the LMS computing circuit 4 processes these two signals thus inputted to update the coefficient of the adaptive filter 2. Here, the whitening circuit 6*e* controls the frequency characteristic of the error signal from the microphone 1*b* to be made flat to thereby send it to the signal processors 6*a* and 6*f* as their coefficients. As a result, the coefficient of the adaptive filter 2 is updated so as to minimize the output of the signal processor 6*a* thus frequency-controlled, so that a noise signal from a noise source can be suppressed by a control sound signal from the speaker 5. As shown above, the error signal detected by the microphone 1*b* is always flattened by the whitening circuit 6*e*, and the adaptive operation is carried out using the signal thus flattened, so that the noise suppression quantity can be attained at the same level in respective frequency bands, and the converging rate in low frequency bands where the noise level is low can be improved.

Next, a noise suppressor according to one embodiment of a second aspect of this invention will be described below while referring to the drawings attached.

Figure 13:
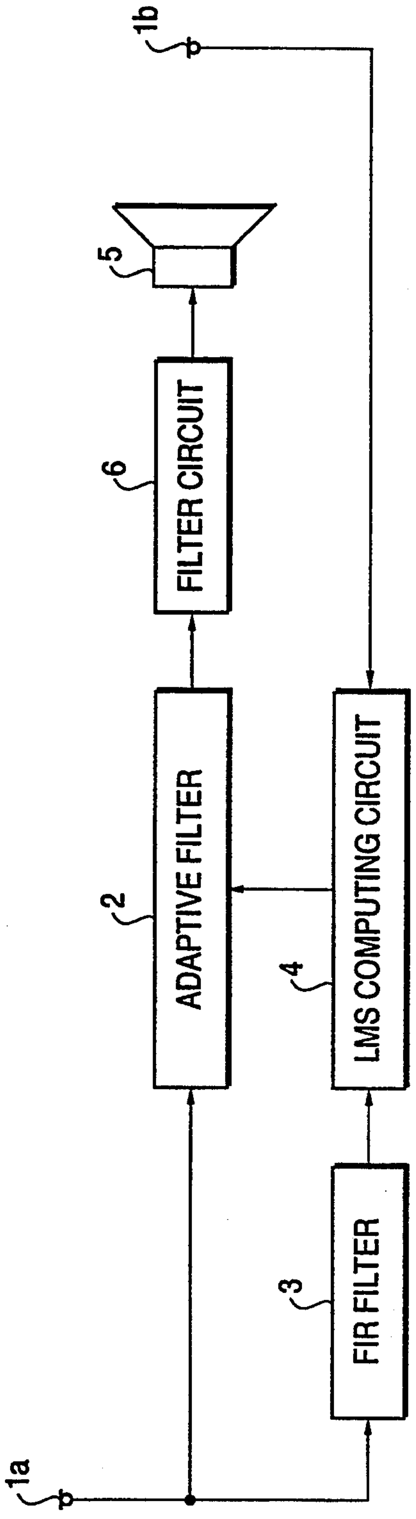
FIG. 13 is a block diagram of a noise suppressor according to one embodiment of a second aspect of this invention.

FIG. 13 is a block diagram of a noise suppressor according to one embodiment of the second aspect of this invention. In FIG. 13, 1*a* and 1*b* are microphones which are a first detector and a second detector, respectively, 2 is an adaptive filter, 3 a FIR filter, 4 a LMS computing circuit, 5 a speaker, and 6 a filter circuit.

The operation of the noise suppressor arranged as above will be explained below. In FIG. 13, a noise signal detected by the microphone 1a is adaptively controlled by the adaptive filter 2, then band-limited by the filter circuit 6 and reproduced by the speaker 5. The reproduced sound signal from the speaker 5 and a noise signal from a noise source are canceled with each other and detected by the microphone 1b as an error signal. The error signal thus detected is sent to the LMS computing circuit 4. On the other hand, the noise signal from the microphone 1a is processed by the FIR filter 3 and sent to the LMS computing circuit 4. Thus, the LMS computing circuit 4 processes these two signals thus inputted to update a coefficient of the adaptive filter 2. Here, the FIR filter 3 has been identified with a transfer function from the filter circuit 6 to the microphone 1b in advance. As a result, the adaptive filter 2 is controlled so as to minimize the error signal thereby, so that the noise signal at the microphone 1b can be attenuated. In this embodiment, by characterizing the filter circuit 6 as described in the first-to-fifth embodiments of the first aspect of this invention, the same effect can be obtained.

In addition, in the event that the noise band is wider than the reproduction band of the speaker 5, the adaptive filter 2 acts to control even a noise signal out of the reproduction band of the speaker 5, and as a result, the speaker 5 may generate a distortion in the reproduction band, resulting in an increase in noise inversely. In this case, however, the filter circuit 6 is provided next to the adaptive filter 2 so that it can selectively pass only a signal whose frequency is in the reproduction band of the speaker 5 therethrough from the output signal of the adaptive filter 2, and such an additional increase in noise as shown above can be prevented from taking place.

Next, a noise suppressor according to one embodiment of a third aspect of this invention will be described below while referring to the drawings attached.

Figure 14:
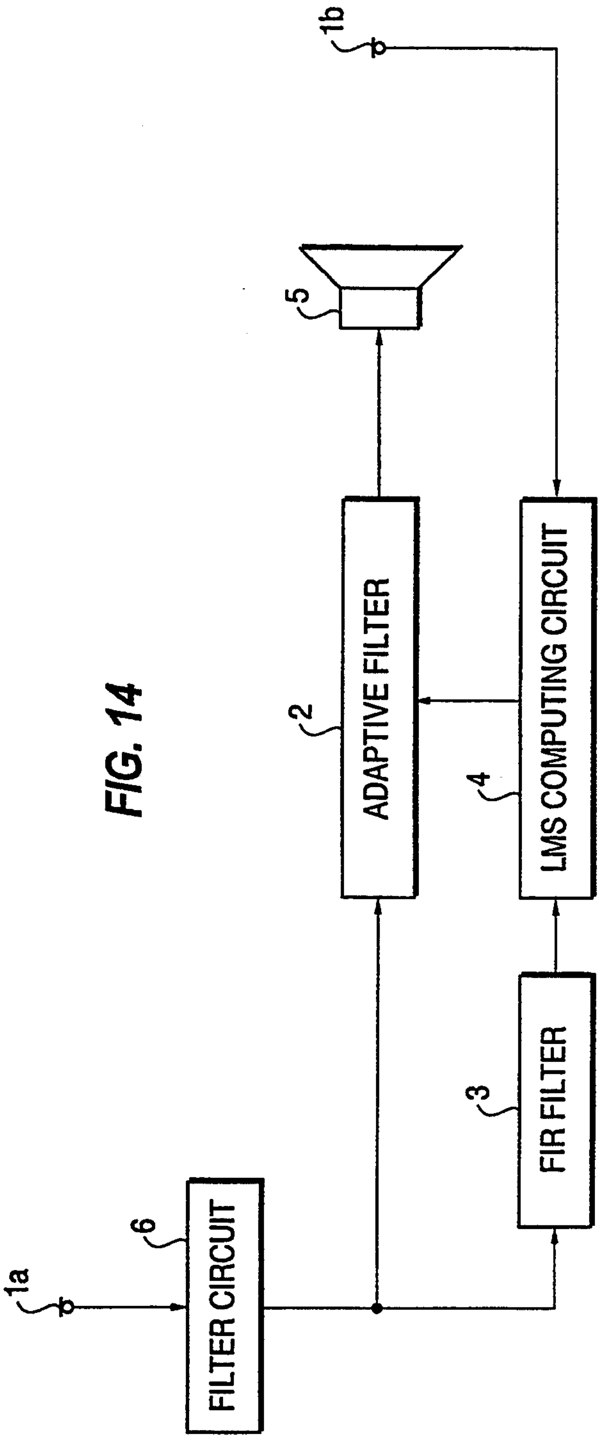
FIG. 14 is a block diagram of a noise suppressor according to one embodiment of a third aspect of this invention.

FIG. 14 is a block diagram of a noise suppressor according to one embodiment of the third aspect of this invention. In FIG. 14, 1a and 1b are microphones which are a first detector and a second detector, respectively, 2 is an adaptive filter, 3 a FIR filter, 4 a LMS filter, 5 a speaker and 6 a filter circuit.

The operation of the noise suppressor arranged as above will be explained below.

A noise signal detected by the microphone 1a is band-limited by the filter circuit 6, then adaptively controlled by the adaptive filter 2 and reproduced by the speaker 5. The reproduced sound signal from the speaker 5 and a noise signal from a noise source are canceled with each other to be detected by the microphone 1b as an error signal, and sent to the LMS computing circuit 4. On the other hand, the noise signal band-limited by the filter circuit 6 is processed by the FIR filter 3 and sent to the LMS computing circuit 4. Thus, the LMS computing circuit 4 processes these two signals thus inputted to update a coefficient of the adaptive filter 2. Here, the FIR filter 3 has been set to have a coefficient substantially equivalent to a transfer function from the speaker 5 to the microphone 1b in advance. As a result, the adaptive filter 2 is controlled so as to minimize the error signal, and as a result, the noise signal at the microphone 1b can be attenuated. In this case, however, by characterizing the filter circuit 6 so as to be described in the first-to-fifth embodiments, the same effect can be obtained.

In addition, by providing the filter circuit 6 precedently to the adaptive filter 2, as compared with the second aspect, the adaptive filter 2 is supplied with only the signal of the band to be controlled, resulting in highly efficient convergence.

Next, a noise suppressor according to one embodiment of a fourth aspect of this invention will be described below while referring to the drawings attached.

Figure 15:
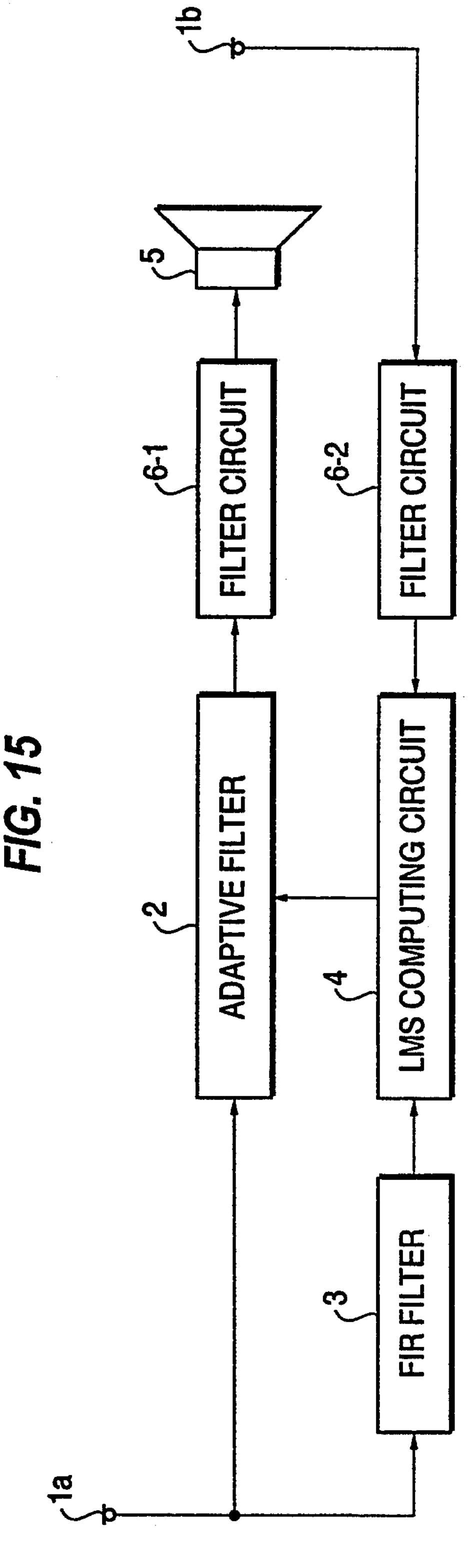
FIG. 15 is a block diagram of a noise suppressor according to one embodiment of a fourth aspect of this invention.

FIG. 15 is a block diagram of a noise suppressor according to one embodiment of the fourth aspect of this invention. In FIG. 15, 1a and 1b are microphones which are a first detector and a second detector, respectively, 2 is an adaptive filter, 3 a FIR filter, 4 a LMS computing circuit, 5 a speaker, and 6-1 and 6-2 are filter circuits.

The operation of the noise suppressor arranged as above will be explained below. A noise signal detected by the microphone 1a is adaptively controlled by the adaptive filter 2, then band-limited by the filter circuit 6-1 and reproduced by the speaker 5. The reproduced sound signal from the speaker 5 and a noise signal from a noise source are canceled with each other and detected by the microphone 1b as an error signal. The error signal thus detected is sent to the filter circuit 6-2 to be band-limited and sent to the LMS computing circuit 4. On the other hand, the noise signal from the microphone 1a is processed by the FIR filter 3 and sent to the LMS computing circuit 4. Thus, the LMS computing circuit 4 processes these two signals thus inputted to update a coefficient of the adaptive filter 2. Here, the FIR filter 3 has been set to have a coefficient substantially equivalent to a transfer function from the filter circuit 6-1 to the filter circuit 6-2 in advance. As a result, the adaptive filter 2 is controlled so as to minimize the error signal, resulting in attenuation of the noise signal at the microphone 1b. In this case, however, by characterizing the filter circuits 6-1 and 6-2 independently of each other as described in the first-to-fifth embodiments of the first aspect of this invention, the same effect can be obtained.

In addition, by supplementarily applying the first and second aspects of this invention with each other, respective effects can be obtained simultaneously and yet reliably.

Next, a noise suppressor according to one embodiment of a fifth aspect of this invention will be described below while referring to the drawings attached.

Figure 16:
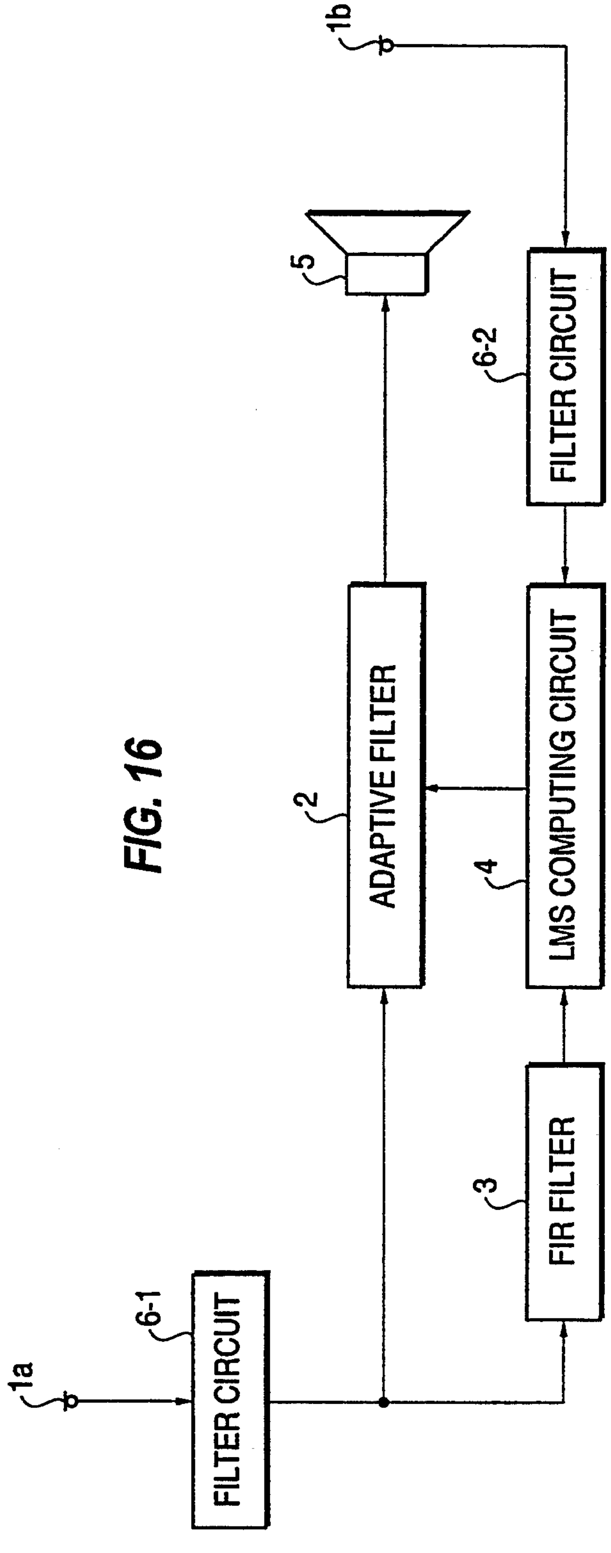
FIG. 16 is a block diagram of a noise suppressor according to one embodiment of a fifth aspect of this invention.
Figure 17:
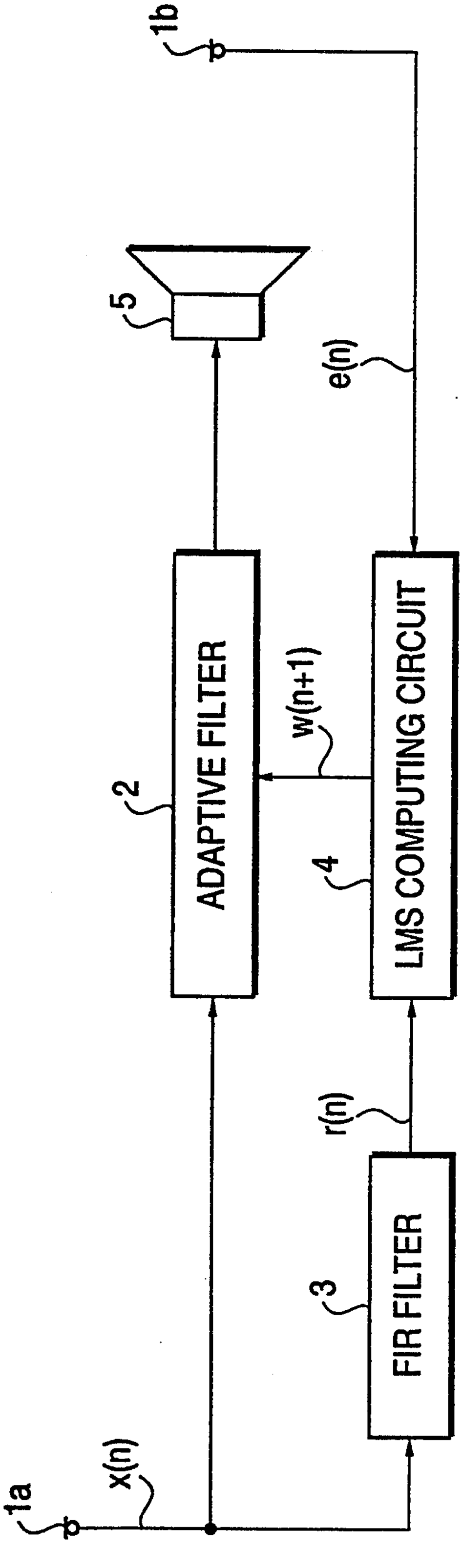
FIG. 17 PRIOR ART
FIG. 17 is a block diagram of a noise suppressor according to the prior art.

FIG. 16 is a block diagram of a noise suppressor according to one embodiment of the fifth aspect of this invention. In FIG. 16, 1a and 1b are microphones which are a first detector and a second detector, respectively, 2 is an adaptive filter, 3 a FIR filter, 4 a LMS computing circuit, 5 a speaker, and 6-1 and 6-2 filter circuit.

The operation of the noise suppressor arranged as above will be explained below. A noise signal detected by the microphone 1a is band-limited by the filter circuit 6-1, then adaptively controlled by the adaptive filter 2 and reproduced by the speaker 5. The reproduced sound signal from the speaker 5 and a noise signal from a noise source are canceled with each other and detected by the microphone 1b as an error signal. The error signal thus detected is band-limited by the filter circuit 6-2 and sent to the LMS computing circuit 4. On the other hand, the noise signal from the filter circuit 6-1 is processed by the FIR filter 3 and sent to the LMS computing circuit 4. Thus, the LMS computing circuit 4 processes these two signals thus inputted to update a coefficient of the adaptive filter 2. Here, the FIR filter 3 has been set to have a coefficient substantially equivalent to a transfer function from the speaker 5 to the filter circuit 6-2 in advance. As a result, the adaptive filter 2 is controlled so as to minimize the error signal, so that the noise signal at the microphone 1*b* can be attenuated. In this case, however, by characterizing the filter circuits 6-1 and 6-2 independently a described in the first-to-fifth embodiments of the first aspect of this invention, the same effect can be obtained.

In addition, by supplementarily applying the first and third aspects of this invention with each other, respective effects can be obtained simultaneously and yet stably.

What is claimed is:

1. A noise suppressor comprising:

a first detector for detecting a noise signal from a noise source;

an adaptive filter for processing the noise signal detected by said first detector;

a speaker responsive to an output signal of said adaptive filter for reproducing a sound;

a second detector for detecting a noise signal at a predetermined evaluating point;

a filter circuit for processing the noise signal detected by said second detector;

a digital filter for processing the noise signal from said first detector by using a coefficient substantially equivalent to a transfer function from said speaker to said filter circuit including said second detector; and a coefficient updating circuit for controlling a coefficient of said adaptive filter according to an output signal of said filter circuit and an output signal of said digital filter, wherein said filter circuit has such a characteristic that passes only a frequency band in which there is a strong correlation between the noise signal detected by said first detector and the noise signal detected by said second detector, and comprises: a coherence computing circuit for computing a coherence of the noise signal detected by said first detector and the noise signal detected by said second detector before a noise control is activated; a Hilbert computing circuit for performing a Hilbert operation by an output signal from said coherence computing circuit; and a signal processor for processing the noise signal inputted thereto by a coefficient set by an output signal of said Hilbert computing circuit when the noise control is activated.

2. A noise suppressor comprising:

a first detector for detecting a noise signal from a noise source;

an adaptive filter for processing the noise signal detected by said first detector;

a speaker responsive to an output signal of said adaptive filter for reproducing a sound;

a second detector for detecting a noise signal at a predetermined evaluating point;

a filter circuit for processing the noise signal detected by said second detector;

a digital filter for processing the noise signal from said first detector by using a coefficient substantially equivalent to a transfer function from said speaker to said filter circuit including said second detector; and a coefficient updating circuit for controlling a coefficient of said adaptive filter according to an output signal of said filter circuit and an output signal of said digital filter, wherein said filter circuit comprises: a whitening circuit for computing a characteristic for flattening a frequency spectrum of the noise signal detected by said second detector; and a first signal processor for processing the noise signal detected by said second detector using the characteristic computed by said whitening circuit as a filter coefficient.

3. A noise suppressor comprising:

a first detector for detecting a noise signal from a noise source;

an adaptive filter for processing the noise signal detected by said first detector;

a speaker responsive to an output signal of said adaptive filter for reproducing a sound;

a second detector for detecting a noise signal at a predetermined evaluating point;

a filter circuit for processing the noise signal detected by said second detector;

a digital filter for processing the noise signal from said first detector by using a coefficient substantially equivalent to a transfer function from said speaker to said filter circuit including said second detector; and a coefficient updating circuit for controlling a coefficient of said adaptive filter according to an output signal of said filter circuit and an output signal of said digital filter, wherein said filter circuit has such a characteristic that passes only a frequency band in which there is a strong correlation between the noise signal detected by said first detector and the noise signal detected by said second detector, and comprises: a correlation computing circuit for computing a correlation function between the noise signal detected by said first detector and the noise signal detected by said second detector before a noise control is activated; and a signal processor operative when the noise control is activated for processing the noise signal inputted thereto using a coefficient set by an output signal of said correlation computing circuit.

4. A noise suppressor comprising:

a first detector for detecting a noise signal from a noise source;

an adaptive filter for processing the noise signal detected by said first detector;

a filter circuit for processing an output signal of said adaptive filter;

a speaker responsive to an output signal of said filter circuit for reproducing a sound;

a second detector for detecting a noise signal at a predetermined evaluating point;

a digital filter for processing the noise signal from said first detector by using a coefficient substantially equivalent to a transfer function from said filter circuit through said speaker to said second detector; and a coefficient updating circuit for controlling a coefficient of said adaptive filter according to the noise signal detected by said second detector and an output signal of said digital filter, wherein said filter circuit has such a characteristic that passes only a frequency band in which there is a strong correlation between the noise signal detected by said first detector and the noise signal detected by said second detector, and comprises: a correlation computing circuit for computing a correlation function between the noise signal detected by said first detector and the noise signal detected by said second detector before a noise control is activated; and a signal processor operative when the noise control is activated for processing the noise signal inputted thereto using a coefficient set by an output signal of said correlation computing circuit.

5. A noise suppressor comprising:

a first detector for detecting a noise signal from a noise source;

a filter circuit for processing the noise signal detected by said first detector;

an adaptive filter for processing an output signal of said filter circuit;

a speaker responsive to an output signal of said adaptive filter for reproducing a sound;

a second detector for detecting a noise signal at a predetermined evaluating point;

a digital filter for processing the noise signal from said filter circuit by using a coefficient substantially equivalent to a transfer function from said speaker to said second detector; and a coefficient updating circuit for controlling a coefficient of said adaptive filter according to the noise signal detected by said second detector and an output signal of said digital filter, wherein said filter circuit has such a characteristic that passes only a frequency band in which there is a strong correlation between the noise signal detected by said first detector and the noise signal detected by said second detector, and comprises: a correlation computing circuit for computing a correlation function between the noise signal detected by said first detector and the noise signal detected by said second detector before a noise control is activated; and a signal processor operative when the noise control is activated for processing the noise signal inputted thereto using a coefficient set by an output signal of said correlation computing circuit.

6. A noise suppressor comprising:

a first detector for detecting a noise signal from a noise source;

an adaptive filter for processing the noise signal detected by said first detector;

a speaker responsive to an output signal of said adaptive filter for reproducing a sound;

a second detector for detecting a noise signal at a predetermined evaluating point;

a filter circuit for processing the noise signal detected by said second detector;

a digital filter for processing the noise signal from said first detector by using a coefficient substantially equivalent to a transfer function from said speaker to said filter circuit including said second detector; and a coefficient updating circuit for controlling a coefficient of said adaptive filter according to an output signal of said filter circuit and an output signal of said digital filter, wherein said filter circuit has a frequency characteristic with respect to a frequency spectrum of the noise signal detected by said second detector so as to flatten the frequency spectrum of the noise signal detected by said second detector.

7. A noise suppressor comprising:

a first detector for detecting a noise signal from a noise source;

an adaptive filter for processing the noise signal detected by said first detector;

a speaker responsive to an output signal of said adaptive filter for reproducing a sound;

a second detector for detecting a noise signal at a predetermined evaluating point;

a filter circuit for processing the noise signal detected by said second detector, a digital filter for processing the noise signal from said first detector by using a coefficient substantially equivalent to a transfer function from said speaker to said filter circuit including said second detector; and a coefficient updating circuit for controlling a coefficient of said adaptive filter according to an output signal of said filter circuit and an output signal of said digital filter, wherein said filter circuit has such a characteristic that cuts off only frequency bands in which the noise signal detected by said first detector and the noise signal detected by said second detector have a weak correlation to each other in a frequency range controllable by said adaptive filter.

8. A noise suppressor comprising:

a first detector for detecting a noise signal from a noise source;

an adaptive filter for processing the noise signal detected by said first detector;

a filter circuit for processing an output signal of said adaptive filter, a speaker responsive to an output signal of said filter circuit for reproducing a sound;

a second detector for detecting a noise signal at a predetermined evaluating point;

a digital filter for processing the noise signal from said first detector by using a coefficient substantially equivalent to a transfer function from said filter circuit through said speaker to said second detector; and a coefficient updating circuit for controlling a coefficient of said adaptive filter according to the noise signal detected by said second detector and an output signal of said digital filter, wherein said filter circuit has such a characteristic that cuts off only frequency bands in which the noise signal detected by said first detector and the noise signal detected by said second detector have a weak correlation to each other in a frequency range controllable by said adaptive filter.

9. A noise suppressor comprising:

a first detector for detecting a noise signal from a noise source;

a filter circuit for processing the noise signal detected by said first detector, an adaptive filter for processing an output signal of said filter circuit;

a speaker responsive to an output signal of said adaptive filter for reproducing a sound;

a second detector for detecting a noise signal at a predetermined evaluating point;

a digital filter for processing the output signal from said filter circuit by using a coefficient substantially equivalent to a transfer function from said speaker to said second detector; and a coefficient updating circuit for controlling a coefficient of said adaptive filter according to the noise signal detected by said second detector and an output signal of said digital filter, wherein said filter circuit has such a characteristic that cuts off only frequency bands in which the noise signal detected by said first detector and the noise signal detected by said second detector have a weak correlation to each other in a frequency range controllable by said adaptive filter.

10. A noise suppressor comprising:

a first detector for detecting a noise signal from a noise source;

an adaptive filter for processing the noise signal detected by said first detector;

a filter circuit for processing an output signal of said adaptive filter;

a speaker responsive to an output signal of said filter circuit for reproducing a sound;

a second detector for detecting a noise signal at a predetermined evaluating point;

a digital filter for processing the noise signal from said first detector by using a coefficient substantially equivalent to a transfer function from said filter circuit through said speaker to said second detector; and a coefficient updating circuit for controlling a coefficient of said adaptive filter according to the noise signal detected by said second detector and an output signal of said digital filter, wherein said filter circuit has such a characteristic that passes only a frequency band in which there is a strong correlation between the noise signal detected by said first detector and the noise signal detected by said second detector, and comprises: a coherence computing circuit for computing a coherence of the noise signal detected by said first detector and the noise signal detected by said second detector before a noise control is acted; a Hilbert computing circuit for performing a Hilbert operation by an output signal from said coherence computing circuit; and a signal processor for processing the noise signal inputted thereto by a coefficient set by an output signal of said Hilbert computing circuit when the noise control is acted.

11. A noise suppressor comprising:

a first detector for detecting a noise signal from a noise source;

a filter circuit for band-limiting the noise signal detected by said first detector;

an adaptive filter for processing an output signal of said filter circuit;

a speaker responsive to an output signal of said adaptive filter for reproducing a sound;

a second detector for detecting a noise signal at a predetermined evaluating point;

a digital filter for processing the noise signal from said first detector by using a coefficient substantially equivalent to a transfer function from said speaker to said second detector; and a coefficient updating circuit for controlling a coefficient of said adaptive filter according to the noise signal detected by said second detector and an output signal of said digital filter, wherein said filter circuit has such a characteristic that passes only a frequency band in which there is a strong correlation between the noise signal detected by said first detector and the noise signal detected by said second detector, and comprises: a coherence computing circuit for computing a coherence of the noise signal detected by said first detector and the noise signal detected by said second detector before a noise control is acted; a Hilbert computing circuit for performing a Hilbert operation by an output signal from said coherence computing circuit; and a signal processor for processing the noise signal inputted thereto by a coefficient set by an output signal of said Hilbert computing circuit when the noise control is acted.

12. A noise suppressor comprising:

a first detector for detecting a noise signal from a noise source;

an adaptive filter for processing the noise signal detected by said first detector;

a speaker responsive to an output signal of said adaptive filter for reproducing a sound;

a second detector for detecting a noise signal at a predetermined evaluating point;

a filter circuit for processing the noise signal detected by said second detector;

a digital filter for processing the noise signal from said first detector by using a coefficient substantially equivalent to a transfer function from said speaker to said second detector; and a coefficient updating circuit for controlling a coefficient of said adaptive filter according to an output signal of said filter circuit and an output signal of said digital filter, wherein said filter circuit comprises: a whitening circuit for computing a characteristic for flattening a frequency spectrum of the noise signal detected by said second detector; a first signal processor for processing the noise signal detected by said second detector using the characteristic computed by said whitening circuit as a filter coefficient to obtain an error signal used for updating the coefficient of said adaptive filter; and a second signal processor for processing the output signal of said digital filter using the same filter coefficient as that of said first signal processor to obtain a reference signal used for updating the coefficient of said adaptive filter.

* * * * *